United States Patent
Tauzin

(10) Patent No.: US 9,123,641 B2
(45) Date of Patent: Sep. 1, 2015

(54) METHOD FOR TRANSFERRING INP FILM

(71) Applicant: COMMISSARIAT A L'ENERGIE ATOMIQUE ET AUX ENERGIES ALTERNATIVES, Paris (FR)

(72) Inventor: Aurelie Tauzin, St Egreve (FR)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 0 days.

(21) Appl. No.: 13/974,347

(22) Filed: Aug. 23, 2013

(65) Prior Publication Data

US 2014/0057423 A1 Feb. 27, 2014

(30) Foreign Application Priority Data

Aug. 23, 2012 (FR) ..................... 12 57969

(51) Int. Cl.
*H01L 21/265* (2006.01)
*H01L 21/762* (2006.01)

(52) U.S. Cl.
CPC ...... *H01L 21/2654* (2013.01); *H01L 21/76254* (2013.01)

(58) Field of Classification Search
None
See application file for complete search history.

(56) References Cited

U.S. PATENT DOCUMENTS

2007/0079751 A1* 4/2007 Matsumoto ............... 117/89
2008/0248631 A1* 10/2008 Letertre et al. ............ 438/459
2008/0311686 A1 12/2008 Morral et al.

FOREIGN PATENT DOCUMENTS

EP 1408545 A2 4/2004
WO 2005060723 A2 7/2005

OTHER PUBLICATIONS

Jalaguier, et. al., Transfer of thin InP films onto silicon substrate by proton implantation process, 11th International Conference on Indium Phosphide and Related Materials, May 1999, p. 26-27.*
Peng Chen et al. "Effects of hydrogen implantation temperature on InP surface blistering", American Institute of Physics, Applied Physics Letters, 2008, pp. 202107-1-202107-3, vol. 92.
S. Hayashi et al. "Temperature dependence of hydrogen-induced exfoliation of InP", American Institute of Physics, Applied Physics Letters, Jul. 12, 2004, pp. 236-238, vol. 85, No. 2.
Shen Honglie et al. "Improved activation in Si+ and P+ dually implanted InP", IOPscience.iop.org, Semicond. Sci. Technol., 1989, pp. 951-954, vol. 4, http://iopscience.iop.org/0268-1242/4/11/009.
Q.-Y. Tong et al., "Low temperature InP layer transfer", Electronics Letters, Feb. 18, 1999, pp. 341-342, vol. 35, No. 4.
R. Singh et al. "The Phenomenology of Ion Implantation-Induced Blistering and Thin-Layer Splitting in Compound Semiconductors", Journal of Electronic Materials, 2010, pp. 2177-2189, vol. 39, No. 10.

* cited by examiner

*Primary Examiner* — Charles Garber
*Assistant Examiner* — Alia Sabur
(74) *Attorney, Agent, or Firm* — Cantor Colburn LLP

(57) ABSTRACT

A method for transferring InP film onto a stiffener substrate, the method including: providing a structure comprising an InP surface layer and an underlying doped thin InP layer; implanting hydrogen ions through the surface layer so as to create a weakened plane in the doped thin layer, delimiting a film comprising the surface layer; placing the surface layer in close contact with a stiffener substrate; and applying heat treatment to obtain splitting at the weakened plane and transfer of the film onto the stiffener substrate.

6 Claims, 2 Drawing Sheets

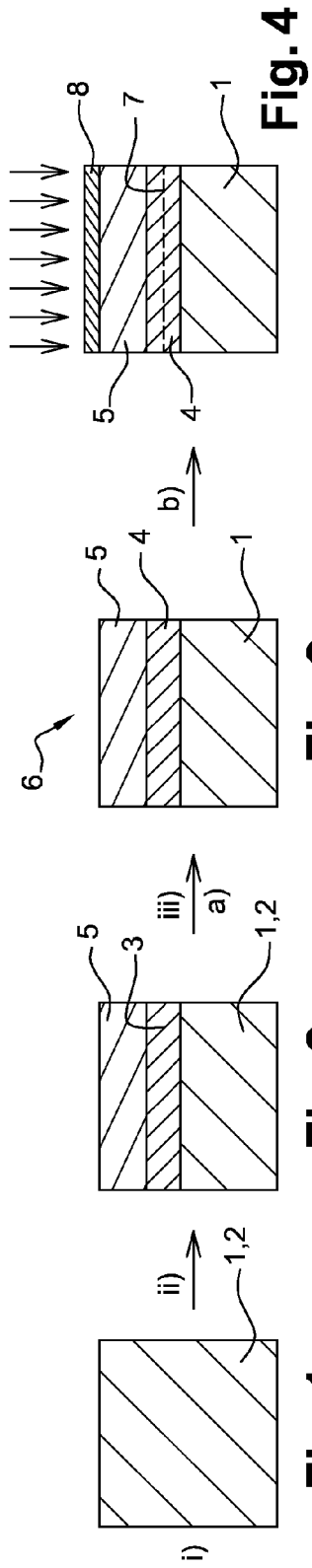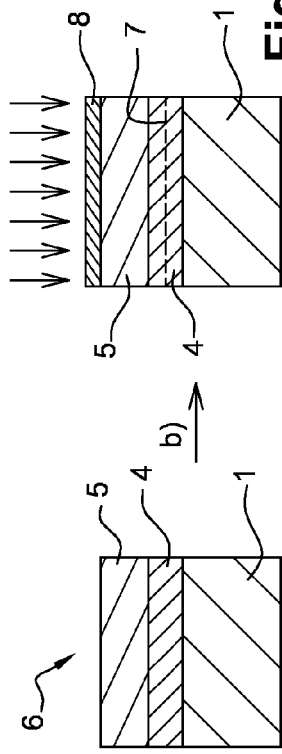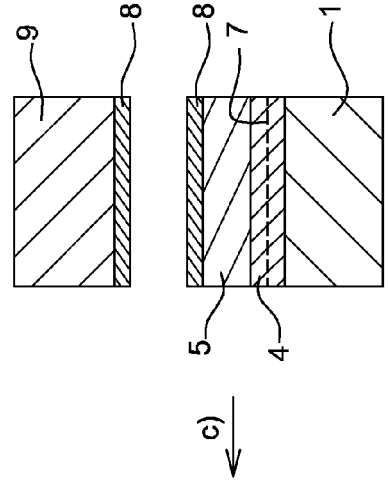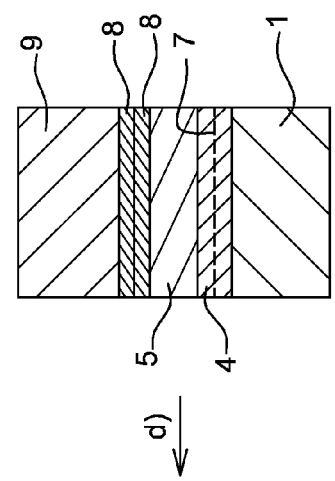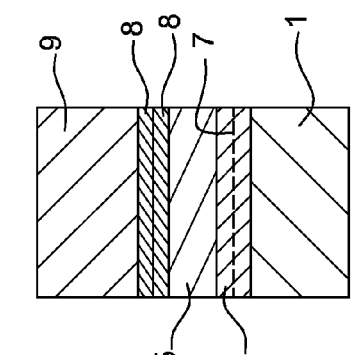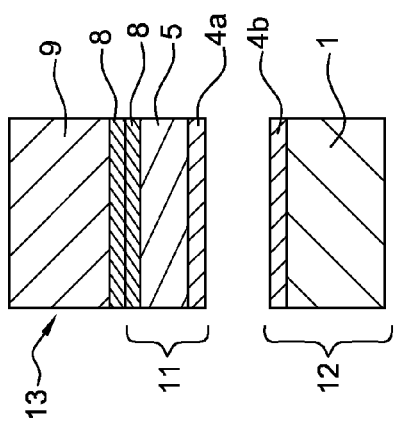

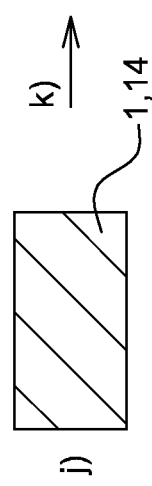
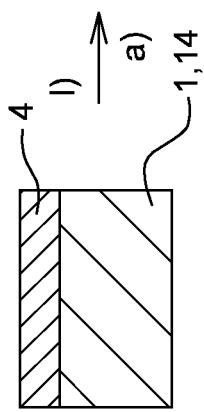
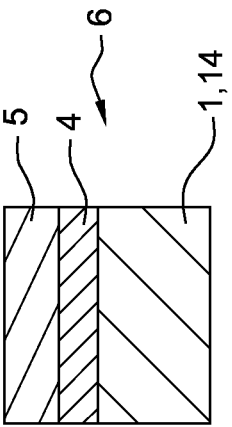
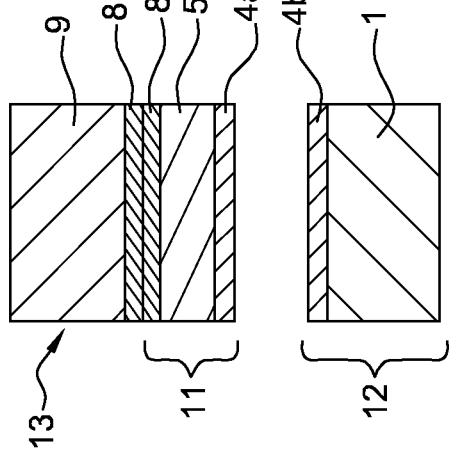
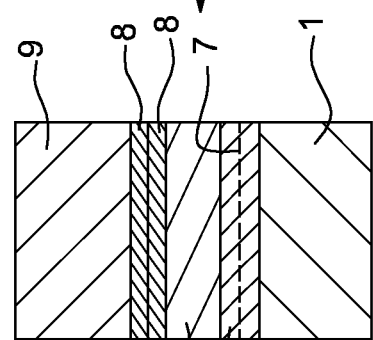
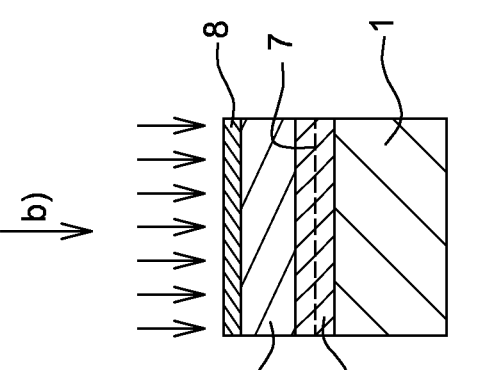

METHOD FOR TRANSFERRING INP FILM

TECHNICAL FIELD

The present invention concerns a method for transferring InP film onto a stiffener substrate.

BACKGROUND

Under Smart Cut™ technology, the splitting of a substrate can be influenced by numerous factors such as the type of implanted ions, implantation energy, implantation dose, implantation current (or current density i.e. the ratio of current to implanted surface area) and implantation temperature.

The implanting conditions of $H^+$ ions compatible with splitting are known and proven for silicon, in particular for heat-activated splitting. Implantation energy is chosen in relation to the thickness of the layers it is desired to transfer. The implantation dose depends on implantation energy: the minimum dose typically varies between $4^E16$ H/cm$^2$ and $6^E16$ H/cm$^2$ when the energy varies between 30 keV and 210 keV. The implantation current can be modified between a few μA and a few mA without major impact on the splitting step: the sole influences of implantation current on the process are a slight variation in the splitting heat treatment to be applied and/or in the transferred thickness and/or in the roughness of the surface obtained after splitting. Similarly, the implantation temperature i.e. the temperature reached in the substrate at the weakened plane formed by the implanted species, may vary between −190° C. and +300° C. without having any blocking impact on the splitting step; as is the case for implantation current, the implantation temperature of the process only has a slight influence on the splitting heat treatment to be applied and/or on transferred thickness and/or on the roughness of the surface obtained after splitting.

In the case of InP, it is known from different documents that the splitting and quality of the transferred films is highly dependent on implantation temperature: for example in the article "Low temperature InP layer transfer" by Q.-Y. Tong, Y.-L. Chao, L.-J. Haung, and U. Gösele, Electron. Lett. 35, 341 (1999), it is indicated that the optimal implantation temperature for InP is in the order of 150 to 200° C., whilst in "Temperature dependence of hydrogen-induced exfoliation of InP" by S. Hayashi, D. Bruno, M. S. Goorsky, published in Appl. Phys. Lett., Vol. 85, No. 2, 12 Jul. 2004, p. 236-238, it is indicated that the optimal temperature is −20° C. These differences in evaluation may derive from parameters not controlled by the authors of these articles such as doping of the substrates, the power supplied by the implanting beam, thermal contact of the substrates during implantation. In addition, since implantation is conducted under vacuum, it is very difficult to measure and maintain the temperature of the implanted substrates throughout the implanting step which may last several hours.

Yet experiments by the Applicant have shown that the optimal implantation temperature of hydrogen to promote heat-activated splitting in InP is between 120 et 180° C. However, when available InP substrates are implanted using a conventional microelectronic implanter, the implantation temperature exceeds 200° C. (e.g. 205° C. for implantation at 20 keV and 100 microamperes on a substrate 50 mm in diameter) and on this account subsequent heat-activated splitting is no longer possible.

BRIEF SUMMARY

The invention provides a method for transferring InP film onto a stiffener substrate, the method comprising:

a) Providing a structure comprising an InP surface layer and an underlying doped thin InP layer;

b) Implanting hydrogen ions through the surface layer so as to form a weakened plane in the doped thin layer, delimiting a film comprising the surface layer;

c) Placing the surface layer in close contact with a stiffener substrate; and d) Applying heat treatment so as to obtain splitting at the weakened plane and transfer of the film onto the stiffener substrate.

Currently available InP substrates are mostly supplied in the form of substrates having resistivity in the order of $10^7$ ohm.cm. Yet this resistivity implies relatively low emissivity in the order of 0.4 to 0.46. By applying Stephan Boltzman's law (whose equation is described below) it follows that the higher the emissivity of the material the lower the temperature reached in the material at the time of implantation.

It is recalled that Stephan Boltzman's equation is stated as follows:

$$T = T_o\left(\frac{UI}{\varepsilon\sigma}\right)^{1/4}$$

$T_0$ representing the temperature of the implantation chamber (ambient temperature), T representing the implantation temperature in the material, U representing implantation energy (in V), I representing current density (in A/m$^2$) and σ being the Stefan-Boltzmann constant of $5.67\times10^{-12}$ W.cm$^{-2}$.K$^{-4}$.

Yet the resistivity of the material has a direct impact on its emissivity. The doping of the material with electrically active elements at step a) of the method of the invention allows the resistivity of the thin layer to be decreased and thereby allows its emissivity to be increased up to 0.75-0.9 for InP. On this account, the implantation temperature in the doped layer of greater emissivity is reduced compared with a non-doped material of lower emissivity. Therefore, with the method of the invention it is possible to obtain heat-activated splitting in accordance with Smart Cut™ technology that is fully reproducible, even when using a conventional implanter. By the term "film" in the present document is meant a thin layer of material having a thickness possibly varying from a few tens of nanometers to a few micrometers.

According to one possibility, the close contacting step c) previously comprises the depositing of a SiO2 layer on the surfaces placed in contact of the surface layer and stiffener substrate respectively, so as to reinforce direct bonding (also called molecular bonding) and facilitate subsequent splitting.

According to one particular provision, the surface layer is doped with the same dopant as the doped thin layer, and preferably with the same concentration of dopants. In this manner, the structure is simple to fabricate.

Advantageously, the doped thin layer comprises a concentration of electrically active dopants of between $10^{17}$ and $10^{20}$ at/cm$^3$ so that the doped thin InP layer has an emissivity of between 0.75 and 0.9, and is adapted to transfer by heat treatment.

By means of this method, it is therefore possible to limit the implantation temperature in the doped thin InP layer to within an optimal range of between 120 and 180° C. so that it is subsequently possible to obtain heat-activated splitting whilst using a conventional microelectronic implanter. By "conventional microelectronic implanter" in the present document is meant an implanter having the following characteristics:

implantation current between a few microamperes and a few milliamperes;

implantation energy between a few KeV and a few hundred KeV;

beam surface area between a few mm² and a few cm²;

mechanical or electrostatic or mixed scanning.

It is to be understood that the emissivity between 0.75 and 0.9 of the doped InP is obtained inter alia at the implantation depth of the hydrogen ions i.e. at the weakened plane.

The method of the invention therefore proposes a simple and easy solution to be used in order to obtain the reproducible transfer of InP film and in particular of resistive InP.

According to one possible embodiment, step a) comprises:

i) providing a resistive InP substrate;

ii) implanting dopant ion species such as S, Sn, Zn, Si, Te, Ge or Se in the substrate so as to form an implanted buried layer delimiting a surface layer between the implanted surface and the buried layer;

iii) applying heat treatment to the buried layer so as electrically to activate the dopant ion species and to form a thin doped layer in an InP material having an emissivity of between 0.75 and 0.9, so as to obtain the structure.

Therefore the preparation of the structure allowing high emissivity to be reached in the InP material is simple to implement, is reproducible and low cost. The heat treatment to activate the dopants can be performed using RTA (Rapid Thermal Annealing) with rapid temperature rise (typically 1000° C. in a few seconds) or a conventional furnace. By the expression "resistive InP" in the present document is meant InP material having resistivity higher than $10^7$ ohm.cm, than $10^8$ ohm.cm, even higher.

Advantageously, the structure is entirely formed of InP so that the coefficients of heat expansion are identical for all the layers of the structure. This leads to identical expansion of the different layers during the different heat treatments applied. In this manner the generation of lattice defects in the surface layer and hence in the film to be transferred, which may occur through different expansion, is avoided. In addition it is possible to make re-use of the substrate after transfer of the film for a new implantation step. The substrate can therefore be recycled several times.

According to one alternative embodiment, step a) comprises:

j)—providing a substrate comprising a seed layer on the surface;

k)—epitaxying a doped thin InP layer on the seed layer; and l)—epitaxying a surface InP layer on the doped thin layer, the doped thin layer having an emissivity of between 0.75 and 0.9, so as to obtain the structure.

Preferably, the seed layer has a lattice parameter adapted to InP epitaxy.

Advantageously the seed layer comprises resistive InP.

In this variant, it is possible to form the entirety of the structure within the same epitaxy chamber which avoids handling the structure at the different stages of its fabrication, reduces the risk of damage and allows very rapid implementation.

According to one possibility, the substrate is formed of the seed layer. Therefore the coefficients of thermal expansion are identical for all the layers of the structure which means that their expansion will be similar during the different heat treatments applied, thereby preventing the generation of defects in the material.

According to another possibility, the substrate comprises the seed layer bonded to a carrier substrate. The choice of type of carrier substrate then no longer needs to take lattice parameter into account and can therefore be chosen so that it is low-cost and preferably has a coefficient of thermal expansion CTE similar to that of the seed layer.

Preferably the InP surface layer is formed of resistive InP chosen from among intrinsic InP or InP whose doping is compensated by a concentration of electrically activated Fe dopants in the order of $10^{15}$ to $10^{16}$ Fe/cm³. Typically, the resistivity of said material is in the order of a few $10^7$ ohm.cm, for example between $2.10^7$ and $10^8$ ohm.cm, even higher.

It is therefore possible to use the most widely available resistive InP substrates and the least costly, and in particular of large size (typically having a diameter of more than 50 mm) whilst optimizing the quality of the transferred InP film. The structure obtained with the method of the invention is advantageously used in applications such as the fabrication via epitaxy of photovoltaic cells in III-V multi-junction materials.

Preferably, step b) comprises a step to implant hydrogen ions with an energy and current density such that the implantation temperature in the doped thin layer is between 120 and 180° C. In this manner it is possible, using a conventional implanter that is easily available and low-cost, to obtain reproducible heat-activated splitting in InP.

BRIEF DESCRIPTION OF THE DRAWINGS

Other aspects and advantages of the present invention will become better apparent on reading the following description of two embodiments thereof given as non-limiting examples and with reference to the appended drawings. In the figures not all the illustrated parts are necessarily drawn to scale for better legibility. Dotted lines symbolise a weakened plane. In the remainder of the description for reasons of simplification identical, similar or equivalent elements of different embodiments carry the same reference numbers.

FIGS. 1 to 7 illustrate one embodiment of the method of the invention.

FIGS. 8 to 13 illustrate a second embodiment of the method of the invention.

DETAILED DESCRIPTION

FIG. 1 illustrates a substrate 1 formed of an initial layer 2, for example in resistive InP, having a diameter of 50 mm (step i). FIG. 2 illustrates the implanting of dopant ion species e.g. Si⁺ ions at an energy of about 150 KeV and dose of about $5.10^{14}$ Si/cm² so as to form a buried layer 3 implanted in the initial layer 2 (step ii). FIG. 3 illustrates the application of heat treatment by rapid thermal annealing (RTA), in the case described here, at a temperature of about 850° C. for 5 seconds, so as electrically to activate the implanted dopant species and so that the buried layer 3 becomes a doped thin layer 4 with a concentration of activated dopants ranging from $2.10^{18}$ to $3.10^{19}$ Si/cm² depending on the implantation profile. In the case concerned here, this doped thin layer 4 lies at a depth of between 0 and 300 nm underneath the implanted surface of the substrate 1 (step iii), the surface layer 5 then forming the surface part of the doped thin layer 4 and is therefore also doped. It would be possible as a variant to implant at greater depth to obtain a more resistive surface layer on the surface 5 or to re-epitaxy a surface layer of InP (in particular of resistive InP) on the surface. The two thin 4 and surface 5 layers form the structure 6. On account of the doping, the thin layer 4 has an emissivity higher than that of the substrate, and in the case here it is in the order of 0.75-0.9 instead of 0.4-0.46 for a resistive InP material.

FIG. 4 illustrates a step of the method (step b) comprising implanting ion species in the structure 6, through the surface layer 5 so as to form a weakened plane 7 in the doped thin layer 4. In the illustrated embodiment, the structure 6 is previously coated with a layer 8 of silicon oxide $SiO_2$ deposited by PECVD (Plasma Enhanced Chemical Vapour Deposition) over a thickness of about 10 nm to avoid damaging the InP surface at the time of implantation. This oxide layer 8 can then be used for bonding via molecular bonding at a subsequent step. Implantation is then performed using a conventional implanter, a Varian E200-1000 implanter in the case illustrated, operating with medium current and electrostatic scanning. The total surface area scanned by the beam of ion species is 9 cm² (3 cm×3 cm). In general, the implantation parameters are determined so that the weakened plane 7 is formed within the doped thin layer 4, the doping of this thin layer at the weakened plane allowing the implantation temperature to be limited to a range of 120-180° C. In the case here the implanted ion species are formed from hydrogen and implantation is conducted with energy of about 20 keV, a dose of about $7^E16$ H/cm² and a current of 50 µA. Under these conditions, the implantation depth of $H^+$ ions is about 200 nm, so that the weakened plane 7 lies at the position of the n+ doped thin InP layer 4. The implantation temperature reached in the doped thin layer 4 is in the order of 140° C., and therefore lies within the range of optimal InP implantation temperatures to obtain splitting (between 120-180° C.).

FIGS. 5 and 6 illustrate a step to place the surface of the surface layer 5, coated here with the layer 8 in SiO2, in close contact with a stiffener substrate 9, here in sapphire (step c). FIG. 5 more precisely illustrates the preparation of the sapphire stiffener substrate 9 on which a layer 8 of silicon oxide $SiO_2$ is deposited by PECVD over a thickness of about 10 nm, then densified by thermal annealing, cleaned and polished by Chemical Mechanical Polishing (CMP). FIG. 6 illustrates the close contacting of the surfaces of the two layers 8 of SiO2 present on the surface layer 5 and on the stiffener substrate 9 respectively.

FIG. 7 illustrates a step of the method in which heat treatment is applied to cause splitting at the weakened plane 7 located in the doped thin layer 4 (step d). In the described example, the heat treatment is applied at a temperature of between 200 and 300° C. A film 11 delimited between the surface of the structure 6 and the weakened plane 7 comprising the surface layer 5 and a residual portion 4a of the doped thin layer 4 is therefore transferred onto the stiffener substrate 9, whilst the negative 12 of the implanted structure 6 comprising the substrate 1 and a residual portion 4b opposite the residual portion 4a along the weakened plane 7, can be recovered. According to one possibility, not illustrated, the negative 12 can be recycled for reuse in the preparation of a new structure 6 and the transfer of a new film 11. In the case illustrated in FIG. 7, an InP film 11 having a thickness of about 200 nm is transferred onto a sapphire stiffener substrate 9. The final structure 13 obtained can advantageously be used as seed for the epitaxy of layers of III-V materials forming III-V multi-junction photovoltaic cells (not illustrated).

According to one non-illustrated variant, the substrate 1 can be formed from an initial surface layer 2 previously bonded or formed by epitaxy on a carrier.

In addition, the dopant ion species can be chosen from among S, Sn, Zn, Si, Te, Ge and Se.

According to one possibility, not illustrated, the stiffener substrate 9 can be formed of any material allowing good molecular bonding with the film 11 and providing a good stiffening effect for splitting and also in relation to subsequent intended applications.

Also, the surface of the transferred film 1 can be prepared with a view to subsequent steps.

FIG. 8 illustrates a substrate 1 formed of a seed layer 14 having a lattice parameter adapted for epitaxial growth of InP. Advantageously it may be resistive InP. FIG. 9 illustrates a first epitaxy of a thin layer 4 of doped material such as InP doped with a concentration of electrically active dopants of between $1.10^{17}$ and $1.10^{10}$ at/cm² allowing local emissivity of about 0.75 to be reached. FIG. 10 illustrates a second epitaxy used to form a surface layer 5 here in resistive InP on the doped thin layer 4. Then, according to the embodiment previously illustrated in FIGS. 4 to 7, FIG. 11 illustrates the implanting of ion species using a conventional implanter (20 keV-100 microamperes) allowing an implantation temperature in the region of 175° C. to be obtained and the forming of a weakened plane 7 in the doped thin layer 4. In non-doped InP material, having resistivity in the order of a few $10^7$ ohm.cm and emissivity in the order of 0.4, the implantation temperature would have reached about 205° C. FIG. 12 illustrates the close contacting of the surfaces of two layers 8 of SiO2 coated on the implanted structure 6 and a stiffener substrate 9 respectively. FIG. 13 illustrates the application of heat treatment to activate InP splitting at the weakened plane 7 allowing the transfer of an InP film 11 onto the stiffener substrate 9.

The present invention therefore proposes a method for transferring InP film 11 at an optimal implantation temperature by means of local doping at the depth of the weakened plane 7 so as locally to raise the emissivity of the material, which is simple to implement.

Evidently the invention is not limited to the embodiment described above as an example but encompasses all technical equivalents and variants of the described means and the combinations thereof.

The invention claimed is:

1. A method for transferring an InP film onto a stiffener substrate, the method comprising:
    a) Providing a structure comprising a surface layer of InP and an underlying doped thin InP layer;
    b) Implanting hydrogen ions through the surface layer so as to create a weakened plane in the doped thin layer, delimiting a film comprising the surface layer,
    c) Placing the surface layer in close contact with a stiffener substrate; and
    d) Applying heat treatment to obtain splitting at the weakened plane and transfer of the film onto the stiffener substrate.

2. The method according to claim 1, wherein the surface layer is doped with the same dopant as the dopant of the doped thin layer.

3. The method according to claim 1, wherein the doped thin layer comprises a concentration of electrically active dopants of between 1017 and 1020 at/cm3 so that the doped thin layer has an emissivity of between 0.75 and 0.9.

4. The method according to claim 1, wherein step a) comprises:
    i) providing a substrate of resistive InP;
    ii) implanting dopant ion species such as S, Sn, Zn, Si, Te, Ge or Se in the substrate so as to form a doped buried layer delimiting a surface layer between the implanted surface and the buried layer;
    iii) applying heat treatment to the buried layer so as electrically to activate the dopant ion species and to form a doped thin layer in InP material having an emissivity of between 0.75 and 0.9, in order to obtain the structure.

5. The method according to claim 1, wherein the InP surface layer is formed of resistive InP chosen from among intrinsic InP or InP whose doping is compensated by a concentration of electrically activated Fe dopants in the order of $10^{15}$ to $10^{16}$ Fe/cm$^3$.

6. The method according to claim 1, wherein step b) comprises a step to implant hydrogen ions at an energy and current density such that the implantation temperature in the doped thin layer is between 120 and 180° C.

* * * * *